US012660661B2

(12) United States Patent
Geyik et al.

(10) Patent No.: US 12,660,661 B2
(45) Date of Patent: Jun. 16, 2026

(54) PACKAGING ARCHITECTURE WITH ROUNDED TRACES FOR ON-PACKAGE HIGH-SPEED INTERCONNECTS

(71) Applicant: Intel Corporation, Santa Clara, CA (US)

(72) Inventors: Cemil S. Geyik, Gilbert, AZ (US); Zhiguo Qian, Chandler, AZ (US); Kristof Kuwawi Darmawikarta, Chandler, AZ (US); Zhichao Zhang, Chandler, AZ (US); Kemal Aygun, Tempe, AZ (US)

(73) Assignee: Intel Corporation, Santa Clara, CA (US)

( * ) Notice: Subject to any disclaimer, the term of this patent is extended or adjusted under 35 U.S.C. 154(b) by 154 days.

(21) Appl. No.: 17/847,282

(22) Filed: Jun. 23, 2022

(65) Prior Publication Data
US 2023/0420347 A1  Dec. 28, 2023

(51) Int. Cl.
| | |
|---|---|
| *H01L 23/498* | (2006.01) |
| *H10W 70/05* | (2026.01) |
| *H10W 70/63* | (2026.01) |
| *H10W 70/65* | (2026.01) |
| *H10W 70/685* | (2026.01) |
| *H10W 74/15* | (2026.01) |
| *H10W 90/00* | (2026.01) |

(52) U.S. Cl.
CPC ......... *H10W 70/685* (2026.01); *H10W 70/05* (2026.01); *H10W 70/635* (2026.01); *H10W 70/65* (2026.01); *H10W 74/15* (2026.01);

*H10W 90/00* (2026.01); *H10W 90/722* (2026.01); *H10W 90/724* (2026.01); *H10W 90/734* (2026.01)

(58) Field of Classification Search
CPC ........... H01L 23/49822; H01L 21/4857; H01L 23/49827; H01L 23/49838
See application file for complete search history.

(56) References Cited

U.S. PATENT DOCUMENTS

| | | | | |
|---|---|---|---|---|
| 2018/0286815 A1* | 10/2018 | Qi | .................... | H01L 23/49822 |
| 2019/0304890 A1* | 10/2019 | Ecton | .................. | H01L 21/4857 |
| 2020/0205279 A1* | 6/2020 | Ecton | ............... | H01L 23/49816 |

* cited by examiner

*Primary Examiner* — Walter H Swanson
(74) *Attorney, Agent, or Firm* — Akona IP PC

(57) ABSTRACT

Embodiments of a microelectronic assembly comprise: a package substrate having a first face and an opposing second face, the package substrate comprising a conductive trace in a dielectric material, a conductive structure at least partially surrounding the conductive trace and separated from the conductive trace by the dielectric material; and an integrated circuit (IC) die attached to the first face of the package substrate and coupled to the conductive trace by a conductive pathway through the package substrate. The conductive trace has a non-rectangular cross-section with rounded corners, the conductive structure comprises a plurality of conductive planes parallel to the conductive trace and coupled to a ground connection.

17 Claims, 7 Drawing Sheets

PACKAGING ARCHITECTURE WITH ROUNDED TRACES FOR ON-PACKAGE HIGH-SPEED INTERCONNECTS

TECHNICAL FIELD

The present disclosure relates to techniques, methods, and apparatus directed to a packaging architecture with rounded traces for on-package high-speed interconnects.

BACKGROUND

Electronic circuits when commonly fabricated on a wafer of semiconductor material, such as silicon, are called integrated circuits (ICs). The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Overview

Figures 1A, 1B, 1C:
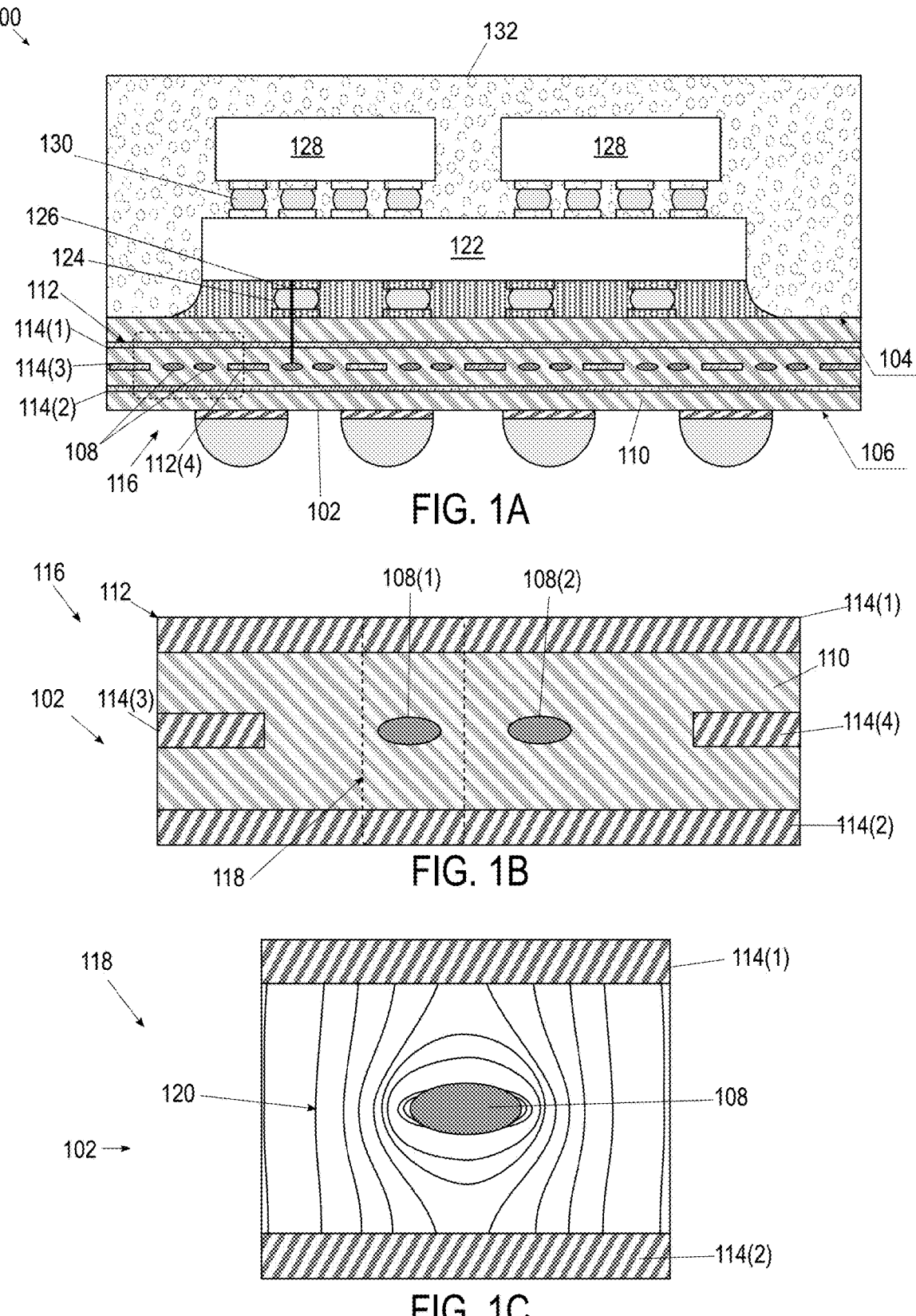
FIG. 1A is a schematic cross-sectional view of an example microelectronic assembly according to some embodiments of the present disclosure.
FIG. 1B is a schematic cross-sectional view of a portion of the example microelectronic assembly of FIG. 1A.
FIG. 1C is a simplified diagram of certain details in a portion of the example microelectronic assembly of FIG. 1A.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

The trend in the computer industry is to utilize multiple processors in large servers, the multiple processors being coupled together in a single package, such as a Multi-Chip Module (MCM). The multiple processors along with other IC dies containing memory circuits (e.g., cache memory circuits, high-bandwidth memory circuits, etc.) are interconnected by high-speed data buses in the package substrate of the MCM, for example, to enable the totality of processors to operate together. Copper interconnect technology is typically used to fabricate these high-speed data buses, but the technology is inherently limited in its ability to scale to the bandwidth/distance requirements of next generation servers. These limitations are primarily associated with signal loss and distortion in the electrical transport media and bandwidth reduction due to skin effect at high data transmission rates.

Further, demand for higher data rate is driving signal speeds in ICs to values greater than 10 GHz. Signals having speeds greater than 10 GHz are considered as high-speed signals. Achieving such high speeds is a challenge in typical package substrates, which are composed of layers of dielectric material with conductive traces between the layers and conductive vias through the layers. In such structures, high-speed signals propagating through the conductive traces and vias experience loss dependent on the dielectric constant of the dielectric material, and the geometry (e.g., width, length, thickness, shape, etc.) of the conductive traces.

As the demand for higher data rates continues to increase, losses in package substrates increase proportionately unless minimized using non-conventional techniques. In a general sense, signal loss in the forms of insertion loss (also simply referred to as "loss" herein) in package substrates, has two major components, considering that radiation loss is negligible in high-speed interconnects: i) dielectric loss, and ii) conductor loss (i.e., loss due to the dielectric surrounding the signal conductor, also called "conductor trace," "trace," or "transmission line" interchangeably herein, and loss due to the transmission line itself). Dielectric loss is independent of the topology and depends only on the dielectric materials. It is proportional to the dissipation factor (Df) of the dielectric material, root of dielectric constant (Dk) of the dielectric material and frequency of the high-speed signals. Thus, one approach to facilitate lower loss is to use dielectric materials with lower Dk. To this end, introduction of new dielectrics and adhesion promotion techniques have been key enablers as technology building blocks for lower loss and higher bandwidth. Material suppliers have been continuously improving their processes and chemistries to reduce the dielectric constant, dissipation factor (e.g., loss tangent) and surface roughness, while providing strong adhesion to the dielectric materials.

Conductor loss can be split into two factors: i) surface roughness induced loss, and ii) bulk conductor loss. Unlike dielectric loss, conductor loss depends on the design rules, shape, and dimensions of the transmission line conducting the high-speed signals. Thus, today's on-package high-speed interconnect loss is largely dominated by bulk conductor loss due to shrinking cross-sectional dimensions (e.g., thinner substrates, small traces, etc.). This dominant factor can be reduced by optimizing transmission line designs for a low-resistance conductor. Fundamentally, larger trace dimensions lead to lower resistance. For the same impedance target, large traces could be used with thicker dielectrics either locally (e.g., by a "skip layer" which is a region in the dielectric above or below a high-speed transmission line where other metal traces are absent) or globally (e.g., non-uniform stack-up).

However, using wider traces without other layout changes may not provide the desired improvement in mitigating insertion loss in package substrates. For example, thicker dielectrics often comes with coarse via design rules resulting in a higher loss in vertical routing. Skip layer comes with a layer count increase. Lower Dk materials may not be desirable for crosstalk-limited interfaces, e.g., double data rate (DDR) memory routing. Reducing target impedance may not always be possible (e.g., impedance of other components in channel) and may result in higher loss due to reflections occurred at impedance discontinuity.

Accordingly, embodiments of a microelectronic assembly disclosed herein comprise a package substrate having a first face and an opposing second face, the package substrate comprising a conductive trace in a dielectric material, a conductive structure at least partially surrounding the conductive trace and separated from the conductive trace by the dielectric material; and an IC die attached to the first face of the package substrate and coupled to the conductive trace by a conductive pathway through the package substrate. The conductive trace has a non-rectangular cross-section with rounded corners, the conductive structure comprises a plurality of conductive planes parallel to the conductive trace and coupled to a ground connection, a first subset of the plurality of conductive planes comprises conductive planes that are not coplanar with the conductive trace and a second subset of the plurality of conductive planes comprises conductive planes that are coplanar with the conductive trace, and the conductive trace is between at least two conductive planes in the first subset.

Various embodiments eliminate sharp corners of the conductive traces where the current density is high. This implementation also allows to use wider traces, which further reduces the loss, since impedance is increased, compared to rectangular traces with the same thickness and width. Such rounded traces as disclosed herein are applicable for both single-ended and differential signals. In general, a differential stripline is frequently used in high-speed systems since in many cases it provides better signal integrity performance compared to signal-ended signaling. For the given stack-up and materials, the smaller the coupling within pair, the lower the loss is. Rounded edges of conductive traces can reduce coupling within pairs. This could be used for pitch reduction as well as loss reduction.

Note that any loss analysis presented herein utilizing an example of a single-ended stripline for the transmission line may be applicable to differential pairs as well, with similar analysis results and techniques. Further, any comparisons made between conductive traces with rectangular cross-section and rounded cross-section assume the same buildup layers in a package substrate, the same dielectric thickness, trace thickness, impedance, etc. Any analysis results disclosed herein for such comparisons assume a perfect ellipse for the conductive traces; however other non-rectangular shapes of the conductive traces, as also different layouts and configurations of package substrates are included herein within the broad scope of the embodiments.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material (e.g., substrate, body) on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a silicon-on-insulator (SOI) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field-effect transistors (FETs), e.g., MOSFETs. In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides, including optical fiber, optical splitters, optical combiners, optical couplers, and optical vias.

The term "waveguide" refers to any structure that acts to guide the propagation of light from one location to another location typically through a substrate material such as silicon or glass. In various examples, waveguides can be formed from silicon, doped silicon, silicon nitride, glasses such as silica (e.g., silicon dioxide or $SiO_2$), borosilicate (e.g., 70-80 wt % $SiO_2$, 7-13 wt % of $B_2O_3$, 4-8 wt % $Na_2O$ or $K_2O$, and 2-8 wt % of $Al_2O_3$) and so forth. Waveguides may be formed using various techniques including but not limited to forming waveguides in situ. For example, in some embodiments, waveguides may be formed in situ in glass using low temperature glass-to-glass bonding or by laser direct writing. Waveguides formed in situ may have lower loss characteristics.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "package substrate" may be used to describe any substrate material that facilitates the packaging together of any collection of semiconductor dies and/or other electrical components such as passive electrical components. As used herein, a package substrate may be formed of any material including, but not limited to, insulating materials such as resin impregnated glass fibers (e.g., PCB or Printed Wiring Boards (PWB)), glass, ceramic, silicon, silicon carbide, etc. In addition, as used herein, a package substrate may refer to a substrate that includes buildup layers (e.g., ABF layers).

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substate, the term "interconnect" may also refer to, respectively, die-to-die (DTD) interconnects and die-to-package substrate (DTPS) interconnects. DTD interconnects may also be referred to as first-level interconnects (FLI). DTPS interconnects may also be referred to as Second-Level Interconnects (SLI).

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be bare (e.g., unpackaged) dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity, and this solder may become an intermetallic compound during processing. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

Note that in the figures, various components (e.g., interconnects) are shown as aligned (e.g., at respective interfaces) merely for ease of illustration; in actuality, some or all of them may be misaligned. In addition, there may be other components, such as bond pads, landing pads, metallization, etc. present in the assembly that are not shown in the figures to prevent cluttering. Further, the figures are intended to show relative arrangements of the components within their assemblies, and, in general, such assemblies may include other components that are not illustrated (e.g., various interfacial layers or various other components related to optical functionality, electrical connectivity, or thermal mitigation). For example, in some further embodiments, the assembly as shown in the figures may include more dies along with other electrical components. Additionally, although some components of the assemblies are illustrated in the figures as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 112a-112e), such a collection may be referred to herein without the letters (e.g., as "112").

Various operations may be described as multiple discrete actions or operations in turn in a manner that is most helpful in understanding the claimed subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1 is a schematic cross-sectional view of an example microelectronic assembly 100 according to some embodiments of the present disclosure. Microelectronic assembly 100 comprises, in the embodiment shown, a package substrate 102 having a first face 104 and an opposing second face 106. Package substrate 102 comprises a conductive trace 108 in a dielectric material 110, an electromagnetic shield 112 at least partially surrounding conductive trace 108 and separated from conductive trace 108 by dielectric material 110. In various embodiments, electromagnetic shield 112 comprises a plurality of conductive plates (e.g., 114(1)-114(4)) parallel to first face 104 (or second face 106) and coupled to a ground connection (not shown).

A portion 116 of package substrate 102 is shown in greater detail in FIG. 18. Conductive trace 108 may comprise a plurality of such traces, for example two mutually parallel conductive traces 108(1) and 108(2) surrounded on all four sides by electromagnetic shield 112. In an example embodiment, some conductive plates 114, for example, conductive plates 114(1) and 114(2) may not be coplanar with conductive traces 108(1) and 108(2) (e.g., conductive plates 114(1) and 114(2) may be above and below conductive traces 108(1) and 108(2) in the particular orientation shown in the figure) and some other conductive plates 114, for example, conductive plates 114(3) and 114(4) may be coplanar with conductive traces 108(1) and 108(2) (e.g., conductive plates 114(3) and 114(4) may be to the left and right of conductive traces 108(1) and 108(2) in the particular orientation shown in the figure). Other configurations of conductive plates 114 and conductive traces 108 are also possible within the broad scope of the embodiments. In some embodiments, electromagnetic shield 112 may comprise conductive structures other than conductive plates 114.

Conductive trace 108 (including conductive traces 108(1) and 108(2)) may have rounded corners and at least one convex surface such that a cross-section of conductive trace 108 is non-rectangular. In the figure, conductive traces 108(1) and 108(2) are shown as elliptical merely for ease of illustration; in practice, they may have any suitable non-rectangular shape formed as a result of certain process conditions as is explained in further detail with reference to other figures. Having rounded shapes facilitates minimizing of current crowding in conductive trace 108, particularly for high-speed signals having a frequency greater than 10 GHz.

FIG. 1C shows example illustration of an electric field 120 around conductive trace 108 in dielectric 110 in a portion 118 of package substrate 102. The lines shown in the figure represent electrical field 120; they are imaginary curves of equipotential lines and can illustrate the magnitude of current density, giving a visual representation of current crowding. For example, lines of higher potential mutually closer together may show higher current density than other lines of lesser potential that are mutually farther apart. Unlike a conventional rectangular shape that exhibits current crowding at the sharp corners of the conductive traces, a non-rectangular rounded shape as shown in the figure allows for smoother current density around conductive trace 108, permitting wider trace widths for decreased insertion loss, or tighter pitches for smaller form factor packages.

Turning back to FIG. 1A, an IC die 122 may be attached to first face 104 of package substrate 102 by DTPS interconnects 124. IC die 122 may be coupled to conductive trace 108 by a conductive pathway 126 through DTPS interconnects 124 and package substrate 102 (e.g., by appropriate conductive vias and other conductive traces not shown in the figure for ease of illustration). Various other IC dies 128 may be coupled to IC die 122 by DTD interconnects 130 to form a stacked multi-chip package. A mold compound 132 may envelop IC dies 122 and 128 in some embodiments. At least one IC die (e.g., IC die 122 or IC die 128) may be configured to operate at signal speeds greater than 10 GHz.

During operation, IC die 122 and/or IC dies 128 may send and/or receive high-speed signals (e.g., signals having a speed greater than 10 GHz) through rounded conductive trace 108. In various embodiments, such rounded conductive traces can be used to provide approximately 8.1% loss reduction at the expense of pitch, or approximately 25.9% pitch reduction for the same loss performance as a conventional rectangular shaped conductive trace.

Figure 2:
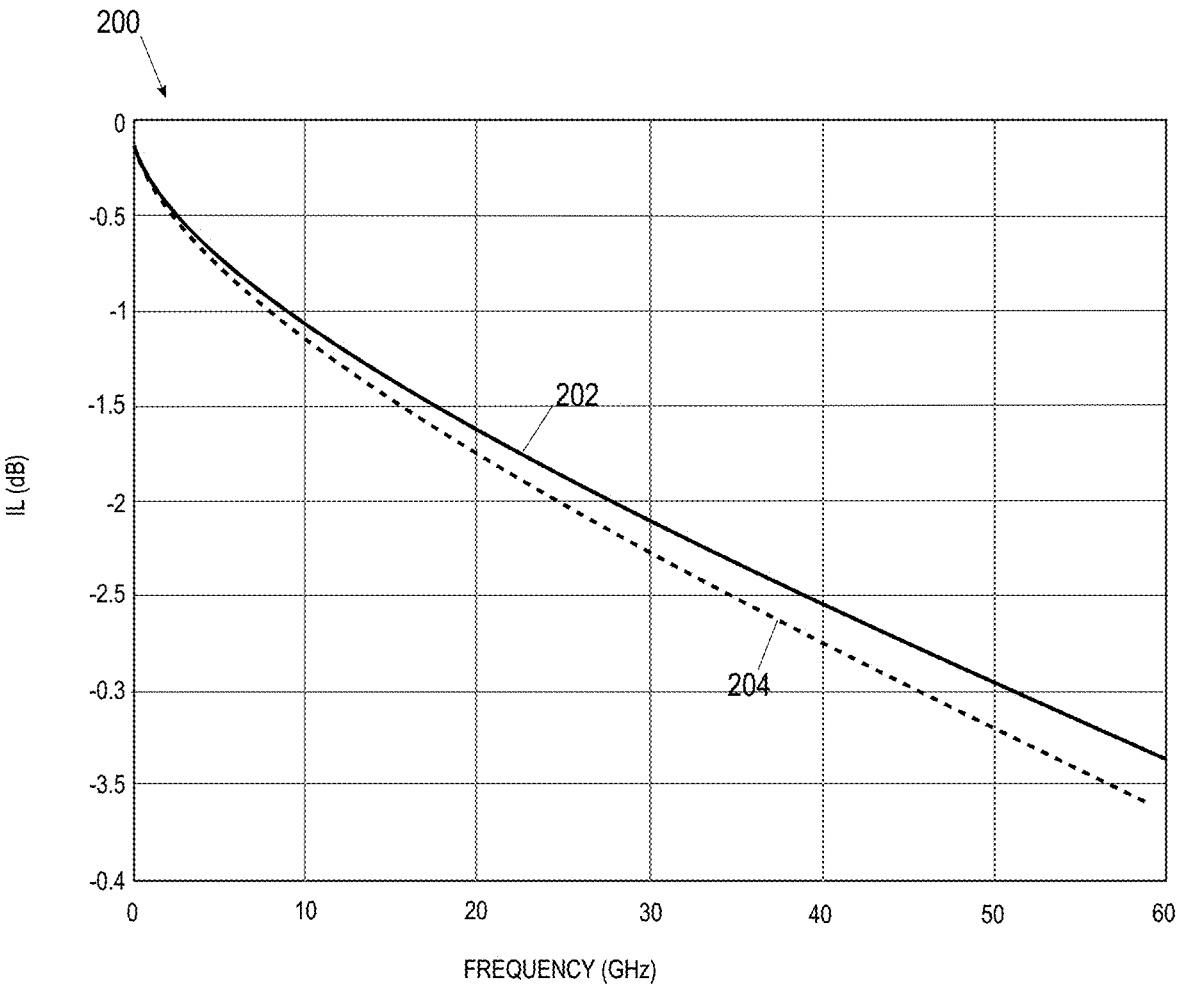
FIG. 2 is a schematic chart of insertion loss with frequency for two different embodiments of an example microelectronic assembly.

FIG. 2 is a schematic chart of insertion loss with frequency for two different embodiments of an example microelectronic assembly 100. Line 202 represents an embodiment of microelectronic assembly 100, with rounded shape for conductive traces 108; line 204 represents another microelectronic assembly with conventional rectangular shape for the conductive traces therein. Rounded conductive traces 108 increases characteristic impedance because capacitance is reduced due to larger effective distance to electromagnetic shield 112 (e.g., grounded conductive plates 114). This results in wider trace width TW, with the exact value of the trace width depending on the specific stack-up (e.g., number of layers of dielectric material 110, amount of metallization in package substrate 102, thickness of the layer of dielectric material 110, material composition and properties of dielectric material 110). Simulation results assuming idealized shapes of elliptical and rectangular conductive traces 108 show that insertion loss at 56 GHz is improved by approximately 8.1% in dB scale. The simulations were performed assuming the following conditions: dielectric thickness of 30 micrometers; trace thickness of 15 micrometers; trace width of 26 micrometers for the rectangular conductive traces and 34 micrometers for the rounded conductive traces, impedance of 40 ohms, resulting in insertion loss of 3.48 dB at 56 GHz for the rectangular conductive trace, and 3.20 dB for the rounded conductive trace. Simulations were also run for a differential pair of conductive traces 108 (e.g., 108(1) and 108(2)). The table below summarizes the simulation conditions and results in terms of decrease in insertion loss or improvement in pitch. For all simulations, the dielectric thickness was assumed to be 30 micrometers, and the trace thickness was assumed to be 15 micrometers.

| Trace Shape | trace width (μm) | trace spacing (μm) | pitch (μm)) | impedance (ohms) | loss at 56 GHz (dB) |
|---|---|---|---|---|---|
| rectangular | 29 | 52 | 81 | 90 | 3.48 |
| rounded | 29 | 52 | 81 | 101 | 3.28 |
| rounded | 38 | 52 | 90 | 90 | 3.20 |
| rounded | 31 | 29 | 60 | 90 | 3.48 |

Rounded conductive traces having the same width as rectangular traces have larger impedance but a smaller loss; rounded conductive traces having the same impedance as rectangular traces can have lower loss with a wider trace resulting in larger pitch, or lower pitch with smaller spacing for the same loss. Thus, in some embodiments, the pitch between rounded conductive traces 108(1) and 108(2) in microelectronic assembly 100 is smaller than in another microelectronic assembly comprising rectangular conductive traces having the same impedance as rounded conductive traces 108(1) and 108(2). In some embodiments where the widths of rounded conductive traces 108(1) and 108(2) may be substantially same as those of rectangular conductive traces, the spacing between such rounded conductive traces 108(1) and 108(2) may be smaller than between the rectangular conductive traces for the same impedance or loss, resulting in tighter pitches. Such tighter pitches can permit a smaller form factor for package substrate 102 in some embodiments.

Figures 3, 4A, 4B:
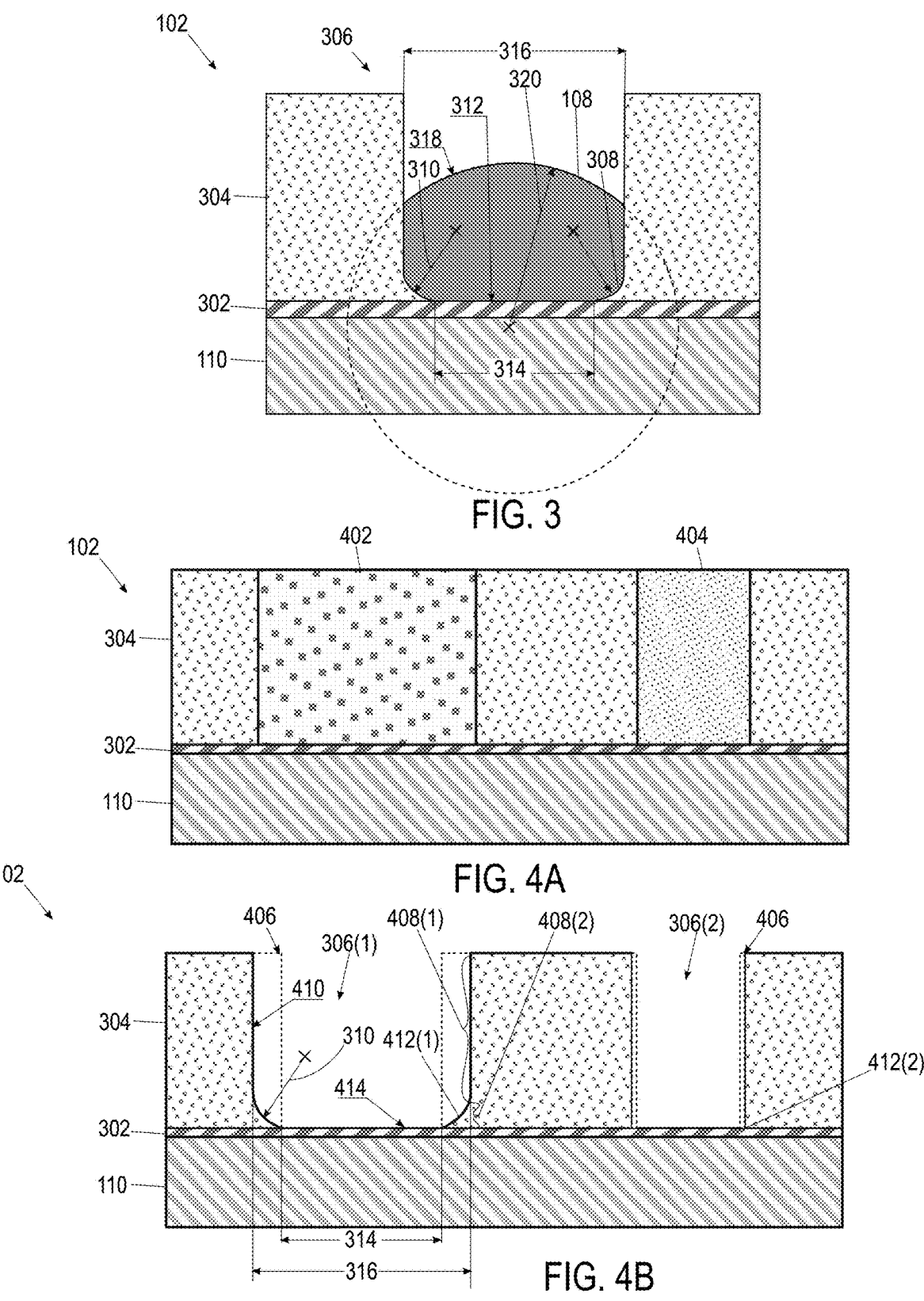
FIG. 3 is a schematic cross-sectional view of a portion of another example microelectronic assembly according to some embodiments of the present disclosure.
FIG. 4A is a schematic cross-sectional view of a portion of yet another example microelectronic assembly during an example fabricating operation according to some embodiments of the present disclosure.
FIG. 4B is a schematic cross-sectional view of a portion of the example microelectronic assembly of FIG. 4A subsequent to another example fabricating operation according to some embodiments of the present disclosure.

FIG. 3 is a schematic cross-sectional view of a portion of another example microelectronic assembly 100, in particular, a portion of package substrate 102, according to some embodiments of the present disclosure. In the example embodiment, package substrate 102 is shown mid-processing, subsequent to deposition of the material of conductive trace 108. During various manufacturing steps, dielectric material 110 may be coated with a seed layer 302, comprising various materials for enhancing adhesion of plated metal, such as copper in a subsequent plating process. In some embodiments, seed layer 302 may comprise electroless nickel; in other embodiments, seed layer 302 may comprise gold. Various other metals and/or combinations of metals may be used in seed layer 302 within the broad scope of the embodiments.

A photoresist 304 may be deposited over seed layer 302 to form trenches 306 in desired regions according to the topography of conductive traces 108 and electromagnetic shield 112. Photoresist 304 may be subjected to light exposure and development in a lithography operation, during which photoresist 304 may be selectively removed to create trench 306, for example, corresponding to the location of conductive trace 108 as shown in the figure. In various embodiments, selectively removing photoresist 304 comprises exposing photoresist 304 to light filtered through a mask pattern configured according to the topology of trenches 306 such that photoresist 304 is developed corresponding to the mask pattern, and etching away any undeveloped photoresist with a photoresist developer.

In some embodiments, photoresist 304 may be a negative photoresist type. In such embodiments, portions of photoresist 304 exposed to the light are insoluble to the photoresist developer, and other portions of photoresist 304 unexposed to the light are dissolved and removed by the photoresist developer. In some other embodiments, photoresist 304 may be a positive photoresist type. In such embodiments, portions of photoresist 304 exposed to the light are dissolved and removed by the photoresist developer, and other portions of photoresist 304 unexposed to the light are insoluble to the photoresist developer. In various embodiments, photoresist 304 includes a mixture of polymer, sensitizer and solvent, commercially available in many different compositions from various manufacturers. Examples of suitable materials for photoresist 304 includes novolac, amine containing polymers, epoxy based resist, and any chemically amplified photoresists.

In various embodiments, rounded conductive trace 108 has corners 308 with a radius of curvature 310. Conductive trace 108 also contacts seed layer 302 along a contact surface 312 having a width 314, for example, to ensure adhesion of conductive trace 108 within package substrate 102. The specific value of width 314 may depend on the dimensions of conductive trace 108, for example, width and thickness, that affects adhesion, delamination under various process and/or operating conditions, etc. In general, width 314 of contact surface 312 may vary between 10 micrometers and 20 micrometers for reasonable process yield. In various embodiments, width 314 may be more than a predetermined threshold of 10 micrometers. Due to the presence of rounded corners 308, width 314 of contact surface 312 is less than width 316 of conductive trace 108. Conductive trace 108 further has at least one convex surface 318 distant from seed layer 302, with a radius of curvature 320.

Rounded conductive traces 108 can be manufactured through a combination of at least two methods in some embodiments: (i) convex surface 318 can be rounded through plating recipe and chemistry selection, and (ii) corners 308 can be rounded by appropriate lithography process parameters. In various embodiments, based on the material composition of photoresist 304 and the dosage of light energy, photoresist 304 develops concave fillets that when filled by the material of conductive trace 108, resulting in corners 308 having radius of curvature 310 for conductive trace 108. In conventional fabrication processes, concave fillets of any radius are undesirable, and hence process optimizations in such processes are directed to prevent their formation; in embodiments disclosed herein on the other hand, the lithography process is specifically tailored to generate the concave fillets of suitable radius, for example, approximately 5 micrometers to 10 micrometers for a thickness of conductive trace 108 around 12 micrometers to 20 micrometers.

In addition, electroplating process parameters, such as plating solution chemistry (e.g., material composition), current density, etc. may be suitably selected to generate convex surface 318 having radius of curvature 320. Radius of curvature 320 may vary between 20 micrometers and 30 micrometers for a thickness of conductive trace 108 around 12 micrometers to 20 micrometers in different embodiments. In conventional fabrication processes, convex surfaces of any radius are undesirable, and hence process optimizations in such processes are directed to prevent their formation; in embodiments disclosed herein on the other hand, the electroplating process is specifically tailored to generate the concave fillets of suitable radius. For example, electroplating process parameters that may be used in an example embodiment are the following: 1 ampere per square decimeter (ASD) and 5 ASD, with plating chemistry that includes at least one of copper sulfate, sulfuric acid, hydrochloric acid, along with sulfur and oxygen containing organic additives.

FIG. 4A is a schematic cross-sectional view of a portion of yet another example microelectronic assembly 100 during an example fabricating operation according to some embodiments of the present disclosure. In various embodiments, seed layer 302 is deposited over dielectric material 110. Photoresist 304 may be deposited over seed layer 302. Photoresist 304 may be selectively removed to form trenches 306 in desired regions, and conductive material may be deposited in trenches 306. In various embodiments, it may be desirable to form trenches in a common layer of photoresist having concave fillets of different radii of curvature. For example, conductive plates 114 that are coplanar with conductive trace 108 may not have rounded corners. Such differently shaped trenches may be formed by appropriate use of light energy dosages and mask patterns during the lithography process. In a general sense, the radius of curvature of the concave fillets vary according to a dosage of light energy to which photoresist 304 is exposed during the selective removal, with smaller radius of curvature corresponding to a larger dosage of the light energy. In some embodiments, different dosages of the light energy may be provided by corresponding greyscale mask patterns, such that greyer areas in the mask patterns block more light energy than other areas in the mask pattern. In other embodiments, the different dosages may be provided by a plurality of passes of the light energy using separate mask patterns for each pass.

Merely as examples and not as limitations, a region 402 in photoresist 304 may be subjected to a smaller dosage of light energy than region 404. As shown in FIG. 4B, subsequent to etching away photoresist 304 in regions 402 and 404, resulting trenches 306(1) and 306(2) respectively have different shapes. More material 406 may be removed in region 402, resulting in two portions 408(1) and 408(2), portion 408(2) being between portion 408(1) and seed layer 302. Trench 306(1) may have: (a) parallel walls 410 in portion 408(1), and (b) concave fillets 412 (1) in portion 408(2) of trench 306(1). Concave fillets 412(1) have radius of curvature 310. Less material 406 may be removed in region 404 to form trench 306(2), resulting in parallel walls 410 substantially through a depth of trench 306(2) without any concave fillets, or with concave fillets 412(2) that have a smaller radius of curvature 310 than concave fillets 412(1). In particular embodiments, the radius of concave fillet 412(2) in trench 306(2) may be zero, or close to zero micrometers. Seed layer 302 is exposed in a gap 414 having width 314 in photoresist 304 between fillets 412(1). Due to the presence of fillets 412(1), width 314 is smaller than width 316.

In various embodiments, any of the features discussed with reference to any of FIGS. 1-9 herein may be combined with any other features to form a package with one or more IC dies as described herein, for example, to form a modified microelectronic assembly 100. Some such combinations are described above, but, in various embodiments, further combinations and modifications are possible.

Example Methods

Figure 5:
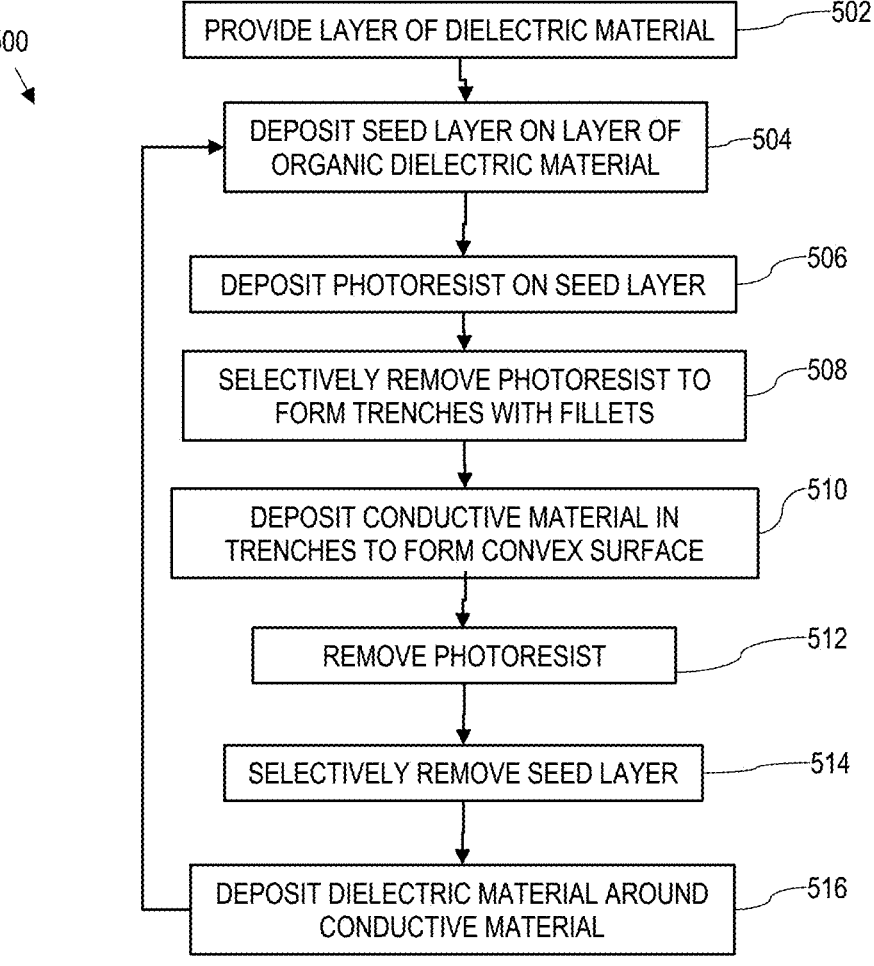
FIG. 5 is a schematic flow-diagram illustrating example operations that may be associated with an example microelectronic assembly according to some embodiments of the present disclosure.

FIG. 5 is a schematic flow-chart of various operations 500 associated with an example microelectronic assembly 100 according to some embodiments of the present disclosure. At 502, one or more layers of dielectric material 110 is provided. At 504, seed layer 302 may be deposited on an exposed surface (e.g., of the topmost layer in the orientation of the figure) of dielectric material 110. In various embodiments, seed layer 302 may be deposited by electroless plating, sputter deposition, or other known techniques in the art. At 506, photoresist 304 may be deposited on seed layer 302, for example, as a dry film in some embodiments.

At 508, photoresist 304 may be selectively removed to form trenches 306 in desired regions (e.g., corresponding to location of conductive traces 108). At least some trenches 306 may have concave fillets 412. Selectively removing photoresist 304 comprises exposing photoresist 304 to light filtered through a mask pattern configured according to the desired regions such that photoresist 304 is developed according to the mask pattern, and subsequently etching away any undeveloped photoresist with a photoresist developer. In embodiments where photoresist 304 is a negative photoresist type, portions of photoresist 304 exposed to the light are insoluble to the photoresist developer and remain behind on seed layer 302, and other portions of photoresist 304 unexposed to the light are dissolved and removed by the photoresist developer. In such embodiments, photoresist 304 in desired regions corresponding to trenches 306 are unexposed to the light. In other embodiments where photoresist 304 is a positive photoresist type, portions of photoresist 304 exposed to the light are dissolved and removed by the photoresist developer, and other portions of photoresist 304 unexposed to the light are insoluble to the photoresist developer and remain behind on seed layer 302. In such embodiments, photoresist 304 in desired regions corresponding to trenches 306 are exposed to the light.

In various embodiments, concave fillets 412 have radius of curvature 310 according to the dosage of light energy to which photoresist 304 is exposed during the selective removal. Radius of curvature 310 may be smaller for a larger dosage of the light energy. In some embodiments, different dosages of the light energy are provided by corresponding greyscale mask patterns, such that greyer areas in the mask patterns block more light energy than other areas in the mask pattern. Depending on whether photoresist 304 is a negative photoresist type or positive photoresist type, the greyscale mask patterns may be configured appropriately such that areas corresponding to rounded conductive traces 108 will receive lesser dosage of light than other areas (e.g., corresponding to conductive plates 114) that are not to have rounded corners. In other embodiments, different dosages of the light energy are provided by a plurality of passes of the light energy using separate mask patterns for each pass. Depending on whether photoresist 304 is a negative photoresist type or positive photoresist type, the separate mask patterns may be configured appropriately such that areas corresponding to rounded conductive traces 108 will receive lesser dosage of light than other areas (e.g., corresponding to conductive plates 114) that are not to have rounded corners. Subsequently, when photoresist 304 is removed by the photoresist developer, a relatively larger portion of material 406 is removed to form trenches 306(1) having larger fillets 412 than in other trenches 306(2) which have smaller fillets or no fillets.

At 510, conductive material of conductive traces 108 and electromagnetic shield 112 (e.g., conductive plates 114) may be deposited in trenches 306 such that the conductive material in one or more trenches 306 has convex surface 318 having radius of curvature 320. Radius of curvature 320 may vary based on the electroplating chemistry and current used in the electroplating process as is known in the art. At 512, any remaining photoresist 304 may be removed, for example, around conductive traces 108 and conductive plates 114 as applicable. At 514, seed layer 302 may be selectively etched away, so that the surface of dielectric material 110 is exposed for further processing and any seed layer 302 remaining on the conductive material forms part of conductive trace 108 as appropriate. At 516, additional dielectric material 110 may be deposited around conductive trace 108. The operations may step to 504 and continue thereafter until a suitable package substrate configuration is obtained with a desired number of layers and layout of conductive traces 108 and electromagnetic shield 112 as well as other components (e.g., conductive vias, inductors, resistors, capacitors, etc.).

Although FIG. 5 illustrates various operations performed in a particular order, this is simply illustrative and the operations discussed herein may be reordered and/or repeated as suitable. Further, additional processes which are not illustrated may also be performed without departing from the scope of the present disclosure. Also, various ones of the operations discussed herein with respect to FIG. 5 may be modified in accordance with the present disclosure to fabricate others of microelectronic package 100 disclosed herein. Although various operations are illustrated in FIG. 5 once each, the operations may be repeated as often as desired. For example, one or more operations may be performed in parallel to manufacture and test multiple microelectronic packages substantially simultaneously. In another example, the operations may be performed in a different order to reflect the structure of a particular microelectronic package in which one or more substrates or other components as described herein may be included.

Furthermore, the operations illustrated in FIG. 5 may be combined or may include more details than described. Still further, the various operations shown and described may further include other manufacturing operations related to fabrication of other components of the microelectronic assemblies described herein, or any devices that may include the microelectronic assemblies as described herein. For example, the operations not shown in FIG. 5 may include various cleaning operations, additional surface planarization operations, operations for surface roughening, operations to include barrier and/or adhesion layers as desired, and/or operations for incorporating microelectronic packages as described herein in, or with, an IC component, a computing device, or any desired structure or device.

Example Devices and Components

Figure 6:
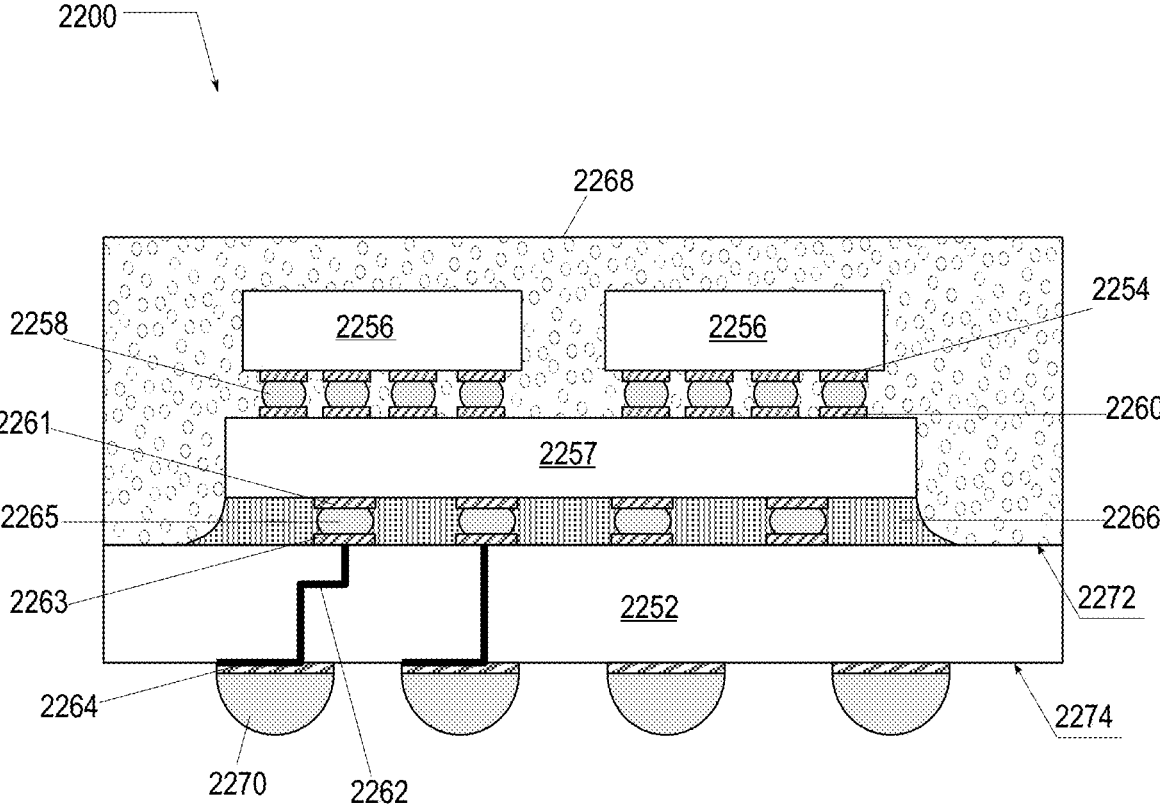
FIG. 6 is a cross-sectional view of a device package that includes one or more microelectronic assemblies in accordance with any of the embodiments disclosed herein.
Figure 7:
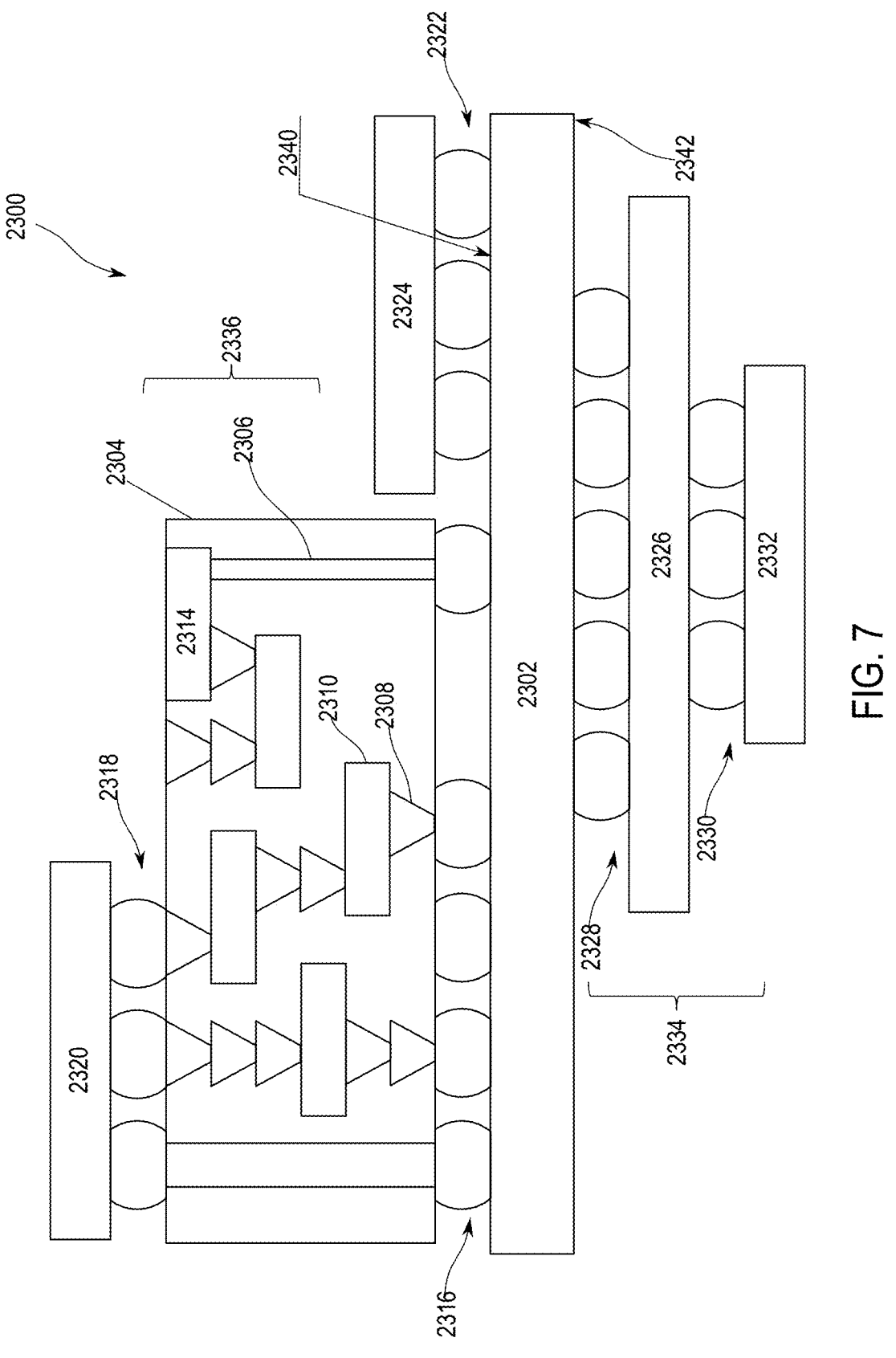
FIG. 7 is a cross-sectional side view of a device assembly that includes one or more microelectronic assemblies in accordance with any of the embodiments disclosed herein.
Figure 8:
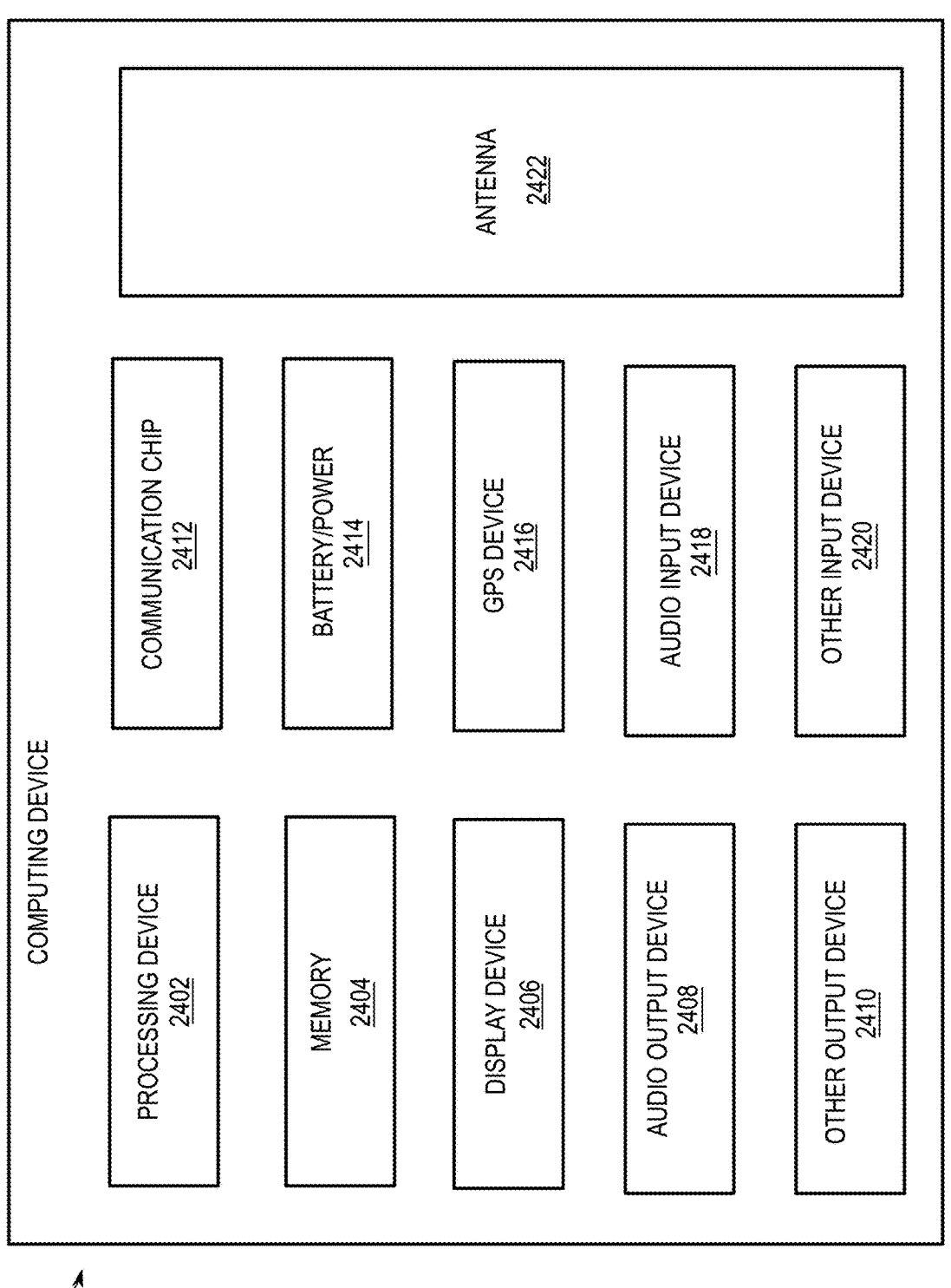
FIG. 8 is a block diagram of an example computing device that includes one or more microelectronic assemblies in accordance with any of the embodiments disclosed herein.

The packages disclosed herein, e.g., any of the embodiments shown in FIGS. 1-5 or any further embodiments described herein, may be included in any suitable electronic component. FIGS. 6-8 illustrate various examples of packages, assemblies, and devices that may be used with or include any of the IC packages as disclosed herein.

FIG. 6 is a side, cross-sectional view of an example IC package 2200 that may include IC packages in accordance with any of the embodiments disclosed herein. In some embodiments, the IC package 2200 may be a SiP.

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 7.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., HBM), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 7 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 6.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 6. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, ESD devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 8 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 6). In yet another example, any one or more of the components of computing device 2400 may include an IC device assembly 2300 (e.g., as shown in FIG. 7).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single system-on-chip (SOC) die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid-state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-MRAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), LTE project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides a microelectronic assembly (e.g., 100), comprising (e.g., FIG. 1A): a package substrate (e.g., 102) having a first face (e.g., 104) and an opposing second face (e.g., 106), the package substrate comprising a conductive trace (e.g., 108) in a dielectric material (e.g., 110), a conductive structure (e.g., electromagnetic shield 112) at least partially surrounding the conductive trace and separated from the conductive trace by the dielectric material; and an integrated circuit (IC) die (e.g., 122, 128) attached to the first face of the package substrate and coupled to the conductive trace by a conductive pathway (e.g., 126) through the package substrate, in which: the conductive trace has a non-rectangular cross-section with rounded corners (e.g., FIG. 1B), the conductive structure comprises a plurality of conductive planes (e.g., 114(1)-114(4)) parallel to the conductive trace and coupled to a ground connection, a first subset of the plurality of conductive planes comprises conductive planes (e.g., 114(1), 114(2)) that are not coplanar with the conductive trace and a second subset of the plurality of conductive planes comprises conductive planes (e.g., 114(3), 114(4)) that are coplanar with the conductive trace, and the conductive trace is between at least two conductive planes (e.g., 114(1), 114(2)) in the first subset.

Example 2 provides the microelectronic assembly of example 1, in which: the conductive trace is between at least two conductive planes (e.g., 114(3), 114(4)) in the second subset.

Example 3 provides the microelectronic assembly of any one of examples 1-2, in which the conductive trace is a first conductive trace (e.g., 108(1)), and the package substrate comprises a second conductive trace (e.g., 108(2)) parallel to and coplanar with the first conductive trace, the second conductive trace having a non-rectangular cross-section with rounded corners.

Example 4 provides the microelectronic assembly of example 3, in which the second conductive trace is between at least two conductive planes in the first subset and between at least two conductive planes in the second subset.

Example 5 provides the microelectronic assembly of any one of examples 1-4, in which (e.g., FIG. 3): the conductive trace has corners (e.g., 308) with a first radius of curvature (e.g., 310), the conductive trace has at least one convex surface (e.g., 318) with a second radius of curvature (e.g., 320), the first radius of curvature is in a range of approximately 5 micrometers to 10 micrometers, and the second radius of curvature is in a range of 20 micrometers to 30 micrometers.

Example 6 provides the microelectronic assembly of any one of examples 1-5, in which a pitch between the first conductive trace and the second conductive trace is smaller than in another microelectronic assembly comprising conductive traces with rectangular corners that have impedance matching an impedance of the first conductive trace and the second conductive trace.

Example 7 provides the microelectronic assembly of example 6, in which: widths of the first conductive trace and the second conductive trace are substantially same as the widths of the conductive traces in the another microelectronic assembly, and spacing between the first conductive trace and the second conductive trace is smaller than between the conductive traces of the another microelectronic assembly.

Example 8 provides the microelectronic assembly of any one of examples 1-7, in which: the IC die is configured to operate at signal speeds greater than 10 GHz, and the conductive trace is to conduct signals to and from the IC die during operation, the signals having speeds greater than 10 GHz.

Example 9 provides the microelectronic assembly of example 8, in which the conductive trace has a lesser insertion loss than another conductive trace having rectangular corners and configured to conduct the signals.

Example 10 provides the microelectronic assembly of any one of examples 1-9, in which: the IC die is attached to the first face of the package substrate by die-to-package substrate (DTPS) interconnects (e.g., 124).

Example 11 provides the microelectronic assembly of any one of examples 1-10, in which: the IC die is a first IC die, the microelectronic assembly further comprises a second IC die (e.g., 128) coupled to the first IC die on a side of the first IC die opposite to the package substrate, and the second IC die is coupled to the first IC die by die-to-die interconnects (e.g., 130).

Example 12 provides the microelectronic assembly of any one of examples 1-11, further comprising a mold compound (e.g., 132) enveloping the IC die.

Example 13 provides a package substrate (e.g., 102), comprising: a first layer comprising a first conductive plane (e.g., 114(1)); a second layer comprising a dielectric material (e.g., 110); a third layer comprising a second conductive plane (e.g., 114(3)) and a third conductive plane (e.g., 114(4)), the second conductive plane and the third conductive plane separated from a conductive trace (e.g., 108) by the dielectric material, the second layer between the first layer and the third layer; a fourth layer comprising the dielectric material; and a fifth layer comprising a fourth conductive plane (e.g., 114(2)), in which: the second layer is between the first layer and the third layer, the fourth layer is between the third layer and the fifth layer, and the conductive trace has rounded corners.

Example 14 provides the package substrate of example 13, in which at least two corners of the conductive trace have a first radius of curvature between 5 micrometers and 10 micrometers and at least two other corners of the conductive trace have a second radius of curvature between 20 micrometers and 30 micrometers.

Example 15 provides the package substrate of any one of examples 13-14, in which: the conductive trace is a first conductive trace, the package substrate comprises a second conductive trace parallel and adjacent to the first conductive trace, and the second conductive trace has rounded corners.

Example 16 provides the package substrate of any one of examples 13-15, in which a pitch between the first conductive trace and the second conductive trace is smaller than in another microelectronic assembly comprising conductive traces with rectangular corners that have impedance which matches the impedance of the first conductive trace and the second conductive trace.

Example 17 provides the package substrate of example 16, in which: widths of the first conductive trace and the second conductive trace is similar to the widths of the conductive traces in the another microelectronic assembly, and spacing between the first conductive trace and the second conductive trace is smaller than between the conductive traces of the another microelectronic assembly.

Example 18 provides the package substrate of any one of examples 13-17, in which the conductive trace has a lesser insertion loss when conducting signals having a speed greater than 10 GHz than another conductive trace having rectangular corners.

Example 19 provides a method (e.g., 1000), comprising (e.g., FIGS. 3, 4, 8): providing a layer of a dielectric material (e.g., 110); depositing a seed layer (e.g., 302) comprising metal on the dielectric material; depositing photoresist (e.g., 304) on the seed layer; selectively removing the photoresist to form trenches (e.g., 306) in desired regions; and depositing conductive material (e.g., 108) in the trenches, in which, after the photoresist is selectively removed and before the conductive material is deposited: at least one trench has a first width (e.g., 316), the at least one trench has parallel walls of the photoresist in a first portion (e.g., 408(1)) and concave fillets of the photoresist in a second portion (e.g., 408(2)), the second portion is between the first portion and the seed layer, the seed layer is exposed in a gap (e.g., 414) of a second width (e.g., 314) in the photoresist between the concave fillets, the second width is smaller than the first width.

Example 20 provides the method of example 19, in which: the at least one trench is a first trench (e.g., 306(1)), and another trench is a second trench (e.g., 306(2)), the seed layer is exposed in the second trench, and the second trench does not have concave fillets.

Example 21 provides the method of example 20, in which: the second trench has a third width, and the first width is greater than the third width.

Example 22 provides the method of any one of examples 19-21, in which the second width is greater than a predetermined threshold of 10 micrometers.

Example 23 provides the method of any one of examples 19-22, in which the first width is greater than a predetermined value of 20 micrometers.

Example 24 provides the method of any one of examples 19-23, in which selectively removing the photoresist comprises: exposing the photoresist to light filtered through a mask pattern configured according to the desired regions such that the photoresist is developed according to the mask pattern; and etching away any undeveloped photoresist with a photoresist developer.

Example 25 provides the method of example 24, in which (e.g., negative photoresist): portions of the photoresist exposed to the light are insoluble to the photoresist developer, and other portions of the photoresist unexposed to the light are dissolved and removed by the photoresist developer.

Example 26 provides the method of example 24, in which (e.g., positive photoresist): portions of the photoresist exposed to the light are dissolved and removed by the photoresist developer, and other portions of the photoresist unexposed to the light are insoluble to the photoresist developer.

Example 27 provides the method of any one of examples 24-26, in which the photoresist comprises at least one of novolac, amine containing polymers, epoxy based resist, and chemically amplified photoresists.

Example 28 provides the method of any one of examples 24-27, in which: the concave fillets have a radius of curvature according to a dosage of light energy to which the photoresist is exposed during the selective removal, and the radius of curvature is smaller for a larger dosage of the light energy.

Example 29 provides the method of example 28, in which: different dosages are provided by corresponding greyscale mask patterns having a first pattern area and a second pattern area, the first pattern area is greyer than the second pattern area, and the first pattern area blocks more light energy than the second pattern area such that areas in the photoresist under the first pattern area receives lesser dosage of light energy than other areas in the photoresist under the second pattern area.

Example 30 provides the method of example 28, in which: different dosages are provided by a plurality of passes of the light energy using separate mask patterns for each pass.

Example 31 provides the method of any one of examples 19-30, in which the conductive material has a convex surface after deposition.

Example 32 provides the method of example 31, in which: the conductive material is deposited by an electroplating process, a curvature of the convex surface is determined by at least a plating solution and current density during the electroplating process.

Example 33 provides the method of example 32, in which the plating solution comprises at least one of copper sulfate, sulfuric acid, hydrochloric acid, and organic additives, and the current density is between 1 ampere per square decimeter (ASD) and 5 ASD.

Example 34 provides the method of any one of examples 19-33, further comprising: removing the photoresist; selectively removing the seed layer; depositing the dielectric material around the conductive material to complete formation of a layer of conductive traces.

Example 35 provides the method of example 34, further comprising repeating the formation of the layer of conductive traces multiple times until a desired number of layers is achieved.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly, comprising:
   a package substrate having a first face and an opposing second face, the package substrate comprising a conductive trace in a dielectric material, a conductive structure at least partially surrounding the conductive trace on four sides and separated from the conductive trace by the dielectric material; and
an integrated circuit (IC) die attached to the first face of the package substrate and coupled to the conductive trace by a conductive pathway through the package substrate,
wherein:
   the conductive trace has a non-rectangular cross-section with rounded corners,
   the conductive structure comprises a plurality of conductive planes parallel to the conductive trace,
   a first subset of the plurality of conductive planes comprises conductive planes that are not coplanar with the conductive trace and a second subset of the plurality of conductive planes comprises conductive planes that are coplanar with the conductive trace, and
   the conductive trace is between at least two conductive planes in the first subset.

2. The microelectronic assembly of claim 1, wherein the conductive trace is between at least two conductive planes in the second subset.

3. The microelectronic assembly of claim 1, wherein the IC die is attached to the first face of the package substrate by die-to-package substrate (DTPS) interconnects.

4. The microelectronic assembly of claim 1, wherein the IC die is a first IC die, and the microelectronic assembly further comprising:
   a second IC die coupled to the first IC die on a side of the first IC die opposite to the package substrate, and the second IC die is coupled to the first IC die by die-to-die interconnects.

5. The microelectronic assembly of claim 1, further comprising:
   a mold compound enveloping the IC die.

6. The microelectronic assembly of claim 1, wherein the conductive trace is a first conductive trace, and the package substrate comprises a second conductive trace parallel to and coplanar with the first conductive trace, the second conductive trace having a non-rectangular cross-section with rounded corners.

7. The microelectronic assembly of claim 6, wherein the second conductive trace is between at least two conductive planes in the first subset and between at least two conductive planes in the second subset.

8. The microelectronic assembly of claim 1, wherein:
   the IC die is configured to operate at signal speeds of approximately 10 GHZ, and
   the conductive trace is to conduct signals to and from the IC die during operation, the signals having speeds of approximately 10 GHz.

9. The microelectronic assembly of claim 8, wherein the conductive trace has a lesser insertion loss than another conductive trace having rectangular corners and configured to conduct the signals.

10. The microelectronic assembly of claim 1, wherein the rounded corners of the conductive trace have a first radius of curvature, and the conductive trace has at least one convex surface with a second radius of curvature.

11. The microelectronic assembly of claim 10, wherein the first radius of curvature is in a range of approximately 5 micrometers to 10 micrometers, and the second radius of curvature is in a range of 20 micrometers to 30 micrometers.

12. A microelectronic assembly, comprising:
   a package substrate having a first face and an opposing second face, the package substrate comprising a conductive trace in a dielectric material, a conductive structure at least partially surrounding the conductive trace and separated from the conductive trace by the dielectric material; and an integrated circuit (IC) die attached to the first face of the package substrate and coupled to the conductive trace by a conductive pathway through the package substrate, wherein:

the conductive trace has a non-rectangular cross-section with rounded corners, the conductive structure comprises a plurality of conductive planes parallel to the conductive trace, a first subset of the plurality of conductive planes comprises conductive planes that are not coplanar with the conductive trace and a second subset of the plurality of conductive planes comprises conductive planes that are coplanar with the conductive trace, and the conductive trace is between at least two conductive planes in the first subset;

the conductive trace has corners with a first radius of curvature, the conductive trace has at least one convex surface with a second radius of curvature, the first radius of curvature is in a range of approximately 5 micrometers to 10 micrometers, and the second radius of curvature is in a range of 20 micrometers to 30 micrometers.

13. The microelectronic assembly of claim 12, where the conductive trace is between at least two conductive planes in the second subset.

14. The microelectronic assembly of claim 12, wherein the conductive trace is a first conductive trace, and the package substrate comprises a second conductive trace parallel to and coplanar with the first conductive trace, the second conductive trace having a non-rectangular cross-section with rounded corners.

15. The microelectronic assembly of claim 14, wherein the second conductive trace is between at least two conductive planes in the first subset and between at least two conductive planes in the second subset.

16. The microelectronic assembly of claim 12, wherein the IC die is configured to operate at signal speeds of approximately 10 GHZ, and the conductive trace is to conduct signals to and from the IC die during operation, the signals having speeds of approximately 10 GHz.

17. The microelectronic assembly of claim 16, wherein the conductive trace has a lesser insertion loss than another conductive trace having rectangular corners and configured to conduct the signals.

* * * * *